(12) United States Patent
Brodie et al.

(10) Patent No.: US 11,239,048 B2
(45) Date of Patent: Feb. 1, 2022

(54) ARRAYED COLUMN DETECTOR

(71) Applicant: KLA Corporation, Milpitas, CA (US)

(72) Inventors: Alan D. Brodie, Palo Alto, CA (US); Lawrence P. Muray, Milpitas, CA (US); John Fielden, Los Altos, CA (US)

(73) Assignee: KLA Corporation, Milpitas, CA (US)

(*) Notice: Subject to any disclaimer, the term of this patent is extended or adjusted under 35 U.S.C. 154(b) by 0 days.

(21) Appl. No.: 16/812,720

(22) Filed: Mar. 9, 2020

(65) Prior Publication Data

US 2021/0280386 A1    Sep. 9, 2021

(51) Int. Cl.
*H01J 37/244* (2006.01)
*H01J 37/22* (2006.01)

(52) U.S. Cl.
CPC .......... *H01J 37/244* (2013.01); *H01J 37/226* (2013.01); *H01J 2237/2443* (2013.01)

(58) Field of Classification Search
CPC ............. H01J 37/244; H01J 2237/2443; H01J 2237/2445; H01J 49/025; G01T 1/20; G01T 1/201; G01T 1/2018; G01N 2223/5055; G01N 23/22
USPC ........ 250/397, 311, 368, 367, 370.11, 484.2, 250/486.1, 505.1
See application file for complete search history.

(56) References Cited

U.S. PATENT DOCUMENTS

| | | | | |
|---|---|---|---|---|
| 4,149,074 A | * | 4/1979 | Schliepe | G02B 6/04 250/311 |
| 4,385,238 A | * | 5/1983 | Westerberg | H01J 37/3045 250/491.1 |
| 4,442,355 A | * | 4/1984 | Tamura | G01N 23/22 250/310 |
| 4,596,929 A | * | 6/1986 | Coates | H01J 37/244 250/310 |
| 5,594,253 A | * | 1/1997 | Bueno | G01T 1/201 250/367 |

(Continued)

FOREIGN PATENT DOCUMENTS

KR    1020020077457 A    10/2002

OTHER PUBLICATIONS

PCT International Search Report and Written Opinion for International Application No. PCT/US2020/026489 dated Dec. 4, 2020, 11 pages.

*Primary Examiner* — David A Vanore
(74) *Attorney, Agent, or Firm* — Suiter Swantz pc llo

(57) ABSTRACT

An electron beam inspection system is disclosed, in accordance with one or more embodiments of the present disclosure. The inspection system may include an electron beam source configured to generate one or more primary electron beams. The inspection system may also include an electron-optical column including a set of electron-optical elements configured to direct the one or more primary electron beams to a sample. The inspection system may further include a detection assembly comprising: a scintillator substrate configured to collect electrons emanating from the sample, the scintillator substrate configured to generate optical radiation in response to the collected electrons; one or more light guides; one or more reflective surfaces configured to receive the optical radiation and direct the optical radiation along the one or more light guides; and one or more detectors configured to receive the optical radiation from the light guide.

31 Claims, 8 Drawing Sheets

(56) References Cited

U.S. PATENT DOCUMENTS

| | | | | |
|---|---|---|---|---|
| 5,866,905 | A * | 2/1999 | Kakibayashi | G01N 23/046 250/311 |
| 5,990,483 | A * | 11/1999 | Shariv | H01J 37/244 250/397 |
| 6,211,525 | B1 * | 4/2001 | Cowham | H01J 37/244 250/397 |
| 6,781,124 | B2 * | 8/2004 | Hayn | H01J 37/244 250/310 |
| 7,141,791 | B2 * | 11/2006 | Masnaghetti | H01J 37/05 250/311 |
| 7,276,704 | B1 * | 10/2007 | Shimoi | H01J 43/24 250/366 |
| 7,560,703 | B1 * | 7/2009 | Soltz | H01J 37/244 250/310 |
| 7,714,287 | B1 * | 5/2010 | James | H01J 37/28 250/310 |
| 8,354,638 | B2 * | 1/2013 | Kurata | H01J 37/244 250/311 |
| 8,829,451 | B2 * | 9/2014 | Wang | H01J 37/28 250/368 |
| 10,236,155 | B2 * | 3/2019 | Cheifetz | H01J 37/244 |
| 10,438,769 | B1 * | 10/2019 | Lipkind | H01J 37/1477 |
| 2002/0134937 | A1 * | 9/2002 | Taylor | H01J 37/244 250/311 |
| 2003/0085361 | A1 * | 5/2003 | Howells | H01J 37/244 250/397 |
| 2004/0195520 | A1 * | 10/2004 | Bateman | H01J 43/246 250/397 |
| 2005/0173644 | A1 * | 8/2005 | Gnauck | H01J 37/244 250/370.11 |
| 2005/0230620 | A1 * | 10/2005 | Jacka | H01J 37/244 250/311 |
| 2006/0027748 | A1 * | 2/2006 | Slowko | H01J 37/244 250/310 |
| 2006/0249686 | A1 * | 11/2006 | Slowko | H01J 37/244 250/397 |
| 2009/0200497 | A1 * | 8/2009 | Adamec | H01J 37/261 250/503.1 |
| 2009/0294687 | A1 * | 12/2009 | Shofman | H01J 37/244 250/397 |
| 2010/0288934 | A1 * | 11/2010 | Keppel | A61N 5/1071 250/362 |
| 2010/0294931 | A1 * | 11/2010 | Zarchin | H01J 37/244 250/310 |
| 2011/0291010 | A1 * | 12/2011 | Katane | H01J 37/244 250/310 |
| 2013/0161511 | A1 | 6/2013 | Karimata et al. | |
| 2013/0234032 | A1 * | 9/2013 | Wang | G01T 1/20 250/368 |
| 2015/0214002 | A1 * | 7/2015 | Imamura | H01J 37/244 250/310 |
| 2017/0287676 | A1 | 10/2017 | Sintorn et al. | |
| 2019/0115186 | A1 * | 4/2019 | Sekiguchi | H01J 37/244 |

* cited by examiner

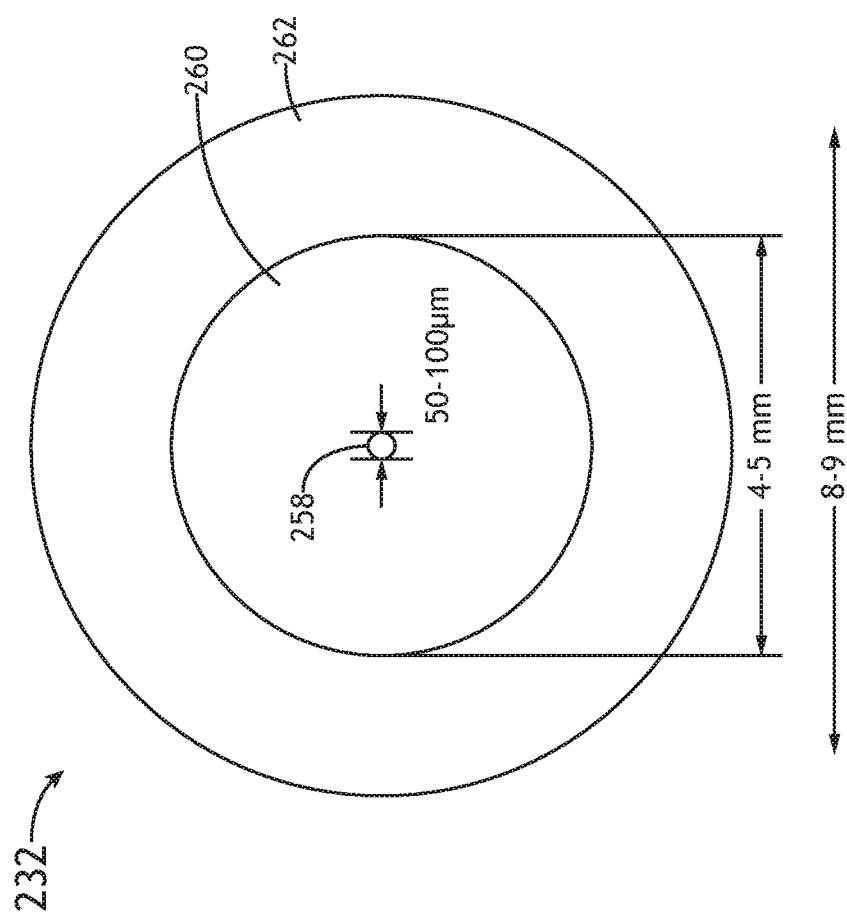

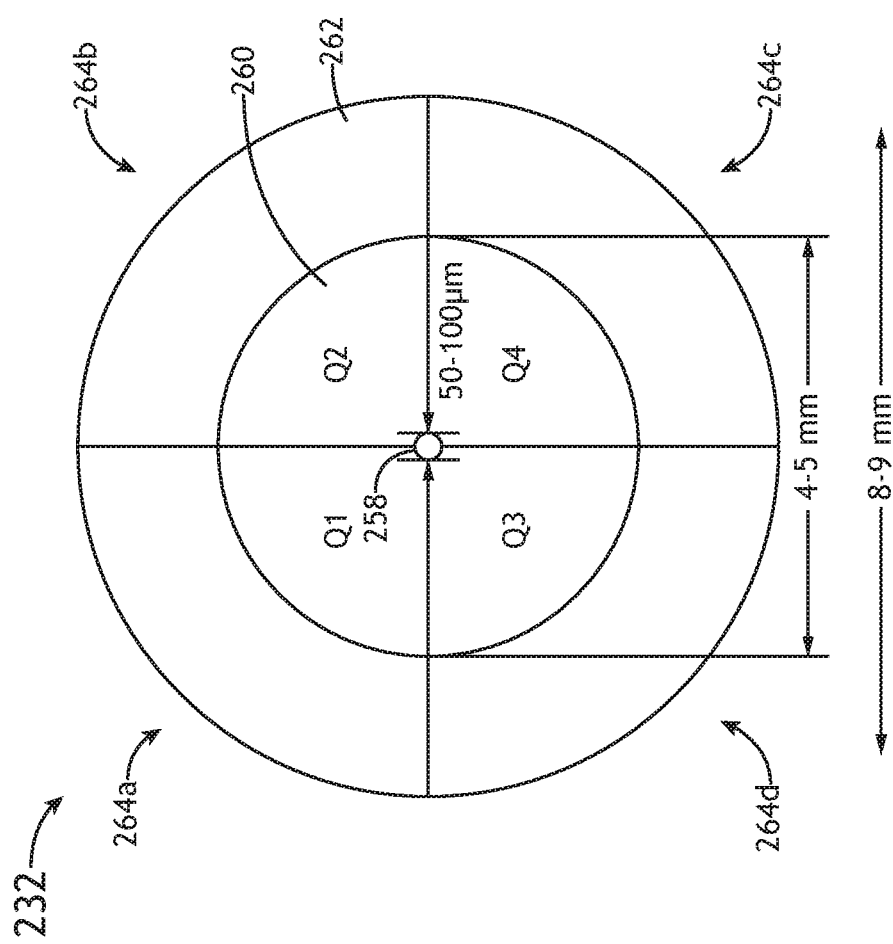

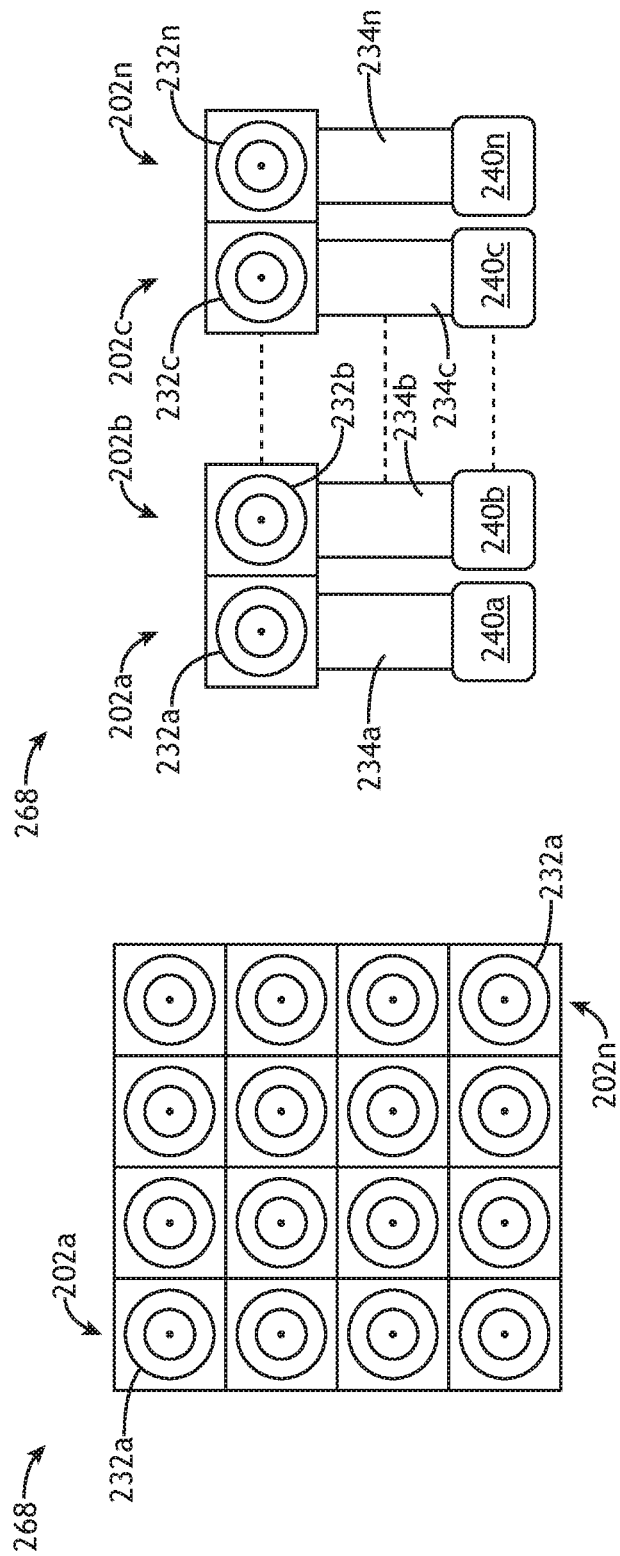

ARRAYED COLUMN DETECTOR

TECHNICAL FIELD

The present disclosure relates generally to particle beam detection and, more particularly, to a high-speed detector for measuring secondary and backscattered electrons.

BACKGROUND

Inspection systems identify and classify defects on semiconductor wafers to generate a defect population on the sample. Inspection systems may include optical inspection systems and charged particle inspection systems, such as electron-beam systems. In the context of electron-beam inspection systems, electron beams are directed to the sample, and detectors are configured to collect secondary and/or backscattered electrons emanated from the sample in order to characterize the sample. Conventionally, electron-beam inspection systems utilize silicon detectors in order to collect secondary and backscattered electrons. However, the capacitance of silicon detectors limits the bandwidth of detection. Additionally, silicon detectors typically require transimpedance amplifiers, which may significantly impact the signal-to-noise ratio (SNR) in low signal environments. Moreover, the transimpedance amplifiers required to amplify currents from the detectors typically must be placed as close as possible to the detectors in order to maximize bandwidth and signal-to-noise ratio. This typically requires placing the transimpedance amplifiers within a vacuum chamber of the electron beam inspection system, which may result in outgassing from the circuit components. Finally, electrical signals from the silicon detectors must be directed a significant distance out of the vacuum chamber prior to being digitized, leading to negative cross-talk and electromagnetic interference (EMI) issues. Therefore, it would be desirable to provide a system and method for curing shortcomings such as those identified above.

SUMMARY

An electron beam inspection system is disclosed. In embodiments, the system may include an electron beam source configured to generate one or more primary electron beams. In additional embodiments, the system includes an electron-optical column including a set of electron-optical elements configured to direct the one or more primary electron beams to a sample. In additional embodiments, the system includes a detection assembly comprising: a scintillator substrate configured to collect electrons emanating from the sample in response to the one or more primary electron beams, the scintillator substrate configured to generate optical radiation in response to the collected electrons; one or more light guides; one or more reflective surfaces configured to receive the optical radiation generated by the scintillator substrate and direct the optical radiation along the one or more light guides; and one or more detectors configured to receive the optical radiation from the light guide.

A multi-column inspection system is disclosed. In embodiments, the system may include an electron beam source configured to generate an array of primary electron beams. In additional embodiments, the system includes a plurality of electron-optical column, each electron-optical column including a set of electron-optical elements configured to direct the primary electron beam of the array of primary electron beams to a sample at an array of locations. In additional embodiments, the system includes a detection assembly comprising: an array of scintillator substrates configured to collect electrons emanating from the sample in response to the array of primary electron beams, the array of scintillator substrate configured to generate optical radiation in response to the collected electrons; a plurality of light guides, the plurality of light guides optically coupled to the array of scintillator substrates; a plurality of reflective surfaces configured to receive the optical radiation generated by a scintillator substrate of the array of scintillator substrates; and a plurality of detectors optically coupled to the plurality of light guides, each detector of the plurality of detectors configured to receive the optical radiation from a light guide of the plurality of light guides.

A method is disclosed. In embodiments, the method includes: generating one or more primary electron beams with an electron beam source; directing the one or more primary electron beams to a sample with an electron-optical column; collecting electrons emanating from the sample in response to the one or more primary electron beams with a scintillator substrate; generating optical radiation with the scintillator substrate in response to the collected electrons; directing, with a reflective surface, the optical radiation to a light guide; directing, with the light guide, the optical radiation to a detector, wherein the detector is configured to generate one or more signals in response to the optical radiation; and determining one or more characteristics of the sample based on the one or more signal.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which:

FIG. 4A is a schematic view of a sample and a scintillator substrate of the electron-beam inspection system, in accordance with one or more embodiments of the present disclosure.

FIG. 4B is a schematic view of a sample and a scintillator substrate of the electron-beam inspection system, in accordance with one or more embodiments of the present disclosure.

FIG. 5A is a schematic view of an array of scintillator substrates of a multi-column inspection system, in accordance with one or more embodiments of the present disclosure.

FIG. 5B is a conceptual view of a multi-column inspection system, in accordance with one or more embodiments of the present disclosure.

DETAILED DESCRIPTION

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Some conventional electron-beam inspection systems utilize silicon detectors in order to collect secondary and backscattered electrons. However, the capacitance of silicon detectors limits the bandwidth of detection. Additionally, silicon detectors typically require transimpedance amplifiers, which may significantly impact the signal-to-noise ratio (SNR) in low signal environments.

Figure 1:
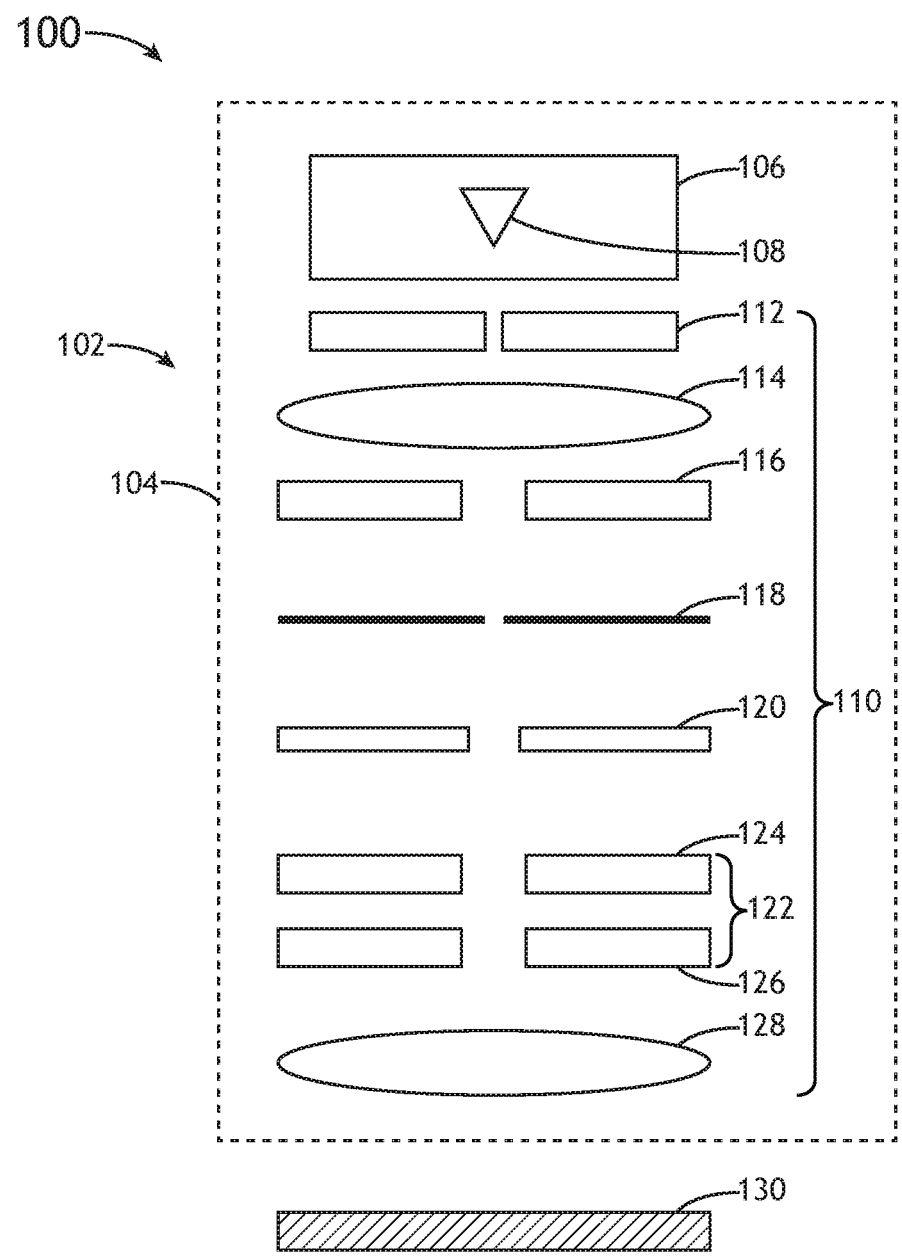
FIG. 1 is a conceptual view of an electron-beam inspection system.

For example, FIG. 1 is a conceptual view of an electron-beam inspection system 100. In particular, the electron-beam inspection system 100 illustrated in FIG. 1 is provided as an example electron-beam inspection system. In this regard, it is contemplated herein that a short description of the electron-beam inspection system 100 may provide a reference point against which attendant advantages of the present disclosure may be compared.

The electron-beam inspection system 100 may include an electron-optical column 102 configured to direct a primary electron beam from an electron source 106 (including an emitter 108) to the surface of a sample 130. The electron-optical column 102 may include a plurality of electron-optical elements 110. The various electron-optical elements of the electron-optical column 102 may be disposed within a vacuum chamber 104.

The plurality of electron-optical elements 110 may include, but are not required to include, one or more extractors 112, one or more condenser lenses 114, one or more alignment deflectors 116, one or more beam limiting apertures 118, one or more detectors 120, one or more scan deflectors 122 (e.g., an upper set of scan deflectors 124 and a lower set of scan deflectors 126), and one or more objective lenses 128. It is noted herein although FIG. 1 depicts a specific electron-optical element configuration, such depiction is provided merely for illustrative purposes and shall not be construed as a limitation on the scope of the present disclosure.

The detector 120 (e.g., a silicon detector) may be configured to collect secondary and/or backscattered electrons emanated from the surface of the sample in response to the primary electron beam. As noted previously herein, silicon detectors (e.g., detector illustrated in FIG. 1) may limit the bandwidth of detection. Moreover, inspection systems utilizing silicon detectors, such as the electron-beam inspection system 100 illustrated in FIG. 1, may require transimpedance amplifiers (not shown) to amplify currents to and from the detectors. These transimpedance amplifiers typically must be placed within the vacuum chamber 104 of the electron-beam inspection system 100, which may result in outgassing of the circuit components. Finally, electrical signals from the silicon detectors must be directed a significant distance out of the vacuum chamber 104 prior to being digitized, leading to negative cross-talk and electromagnetic interference (EMI) issues.

Accordingly, embodiments of the present disclosure are directed to a system and method which cure one or more of the shortfalls of previous approaches identified above. Embodiments of the present disclosure are directed to an electron beam inspection system which utilizes scintillator substrates and light guides in order to detect secondary and backscattered electrons. Additional embodiments of the present disclosure are directed to a multi-column beam inspection system utilizing an array of scintillator substrates and a plurality of light guides in order to detect secondary and backscattered electrons.

It is contemplated herein that embodiments of the present disclosure may provide a low noise, low-profile, high-speed detector which may be used in the context of charged particle (e.g., electron beam) characterization systems. In particular, by enabling electron detection via scintillator substrates and light guides, the system and method of the present disclosure may address many of the shortfalls of previous approaches identified above.

Figure 2A:
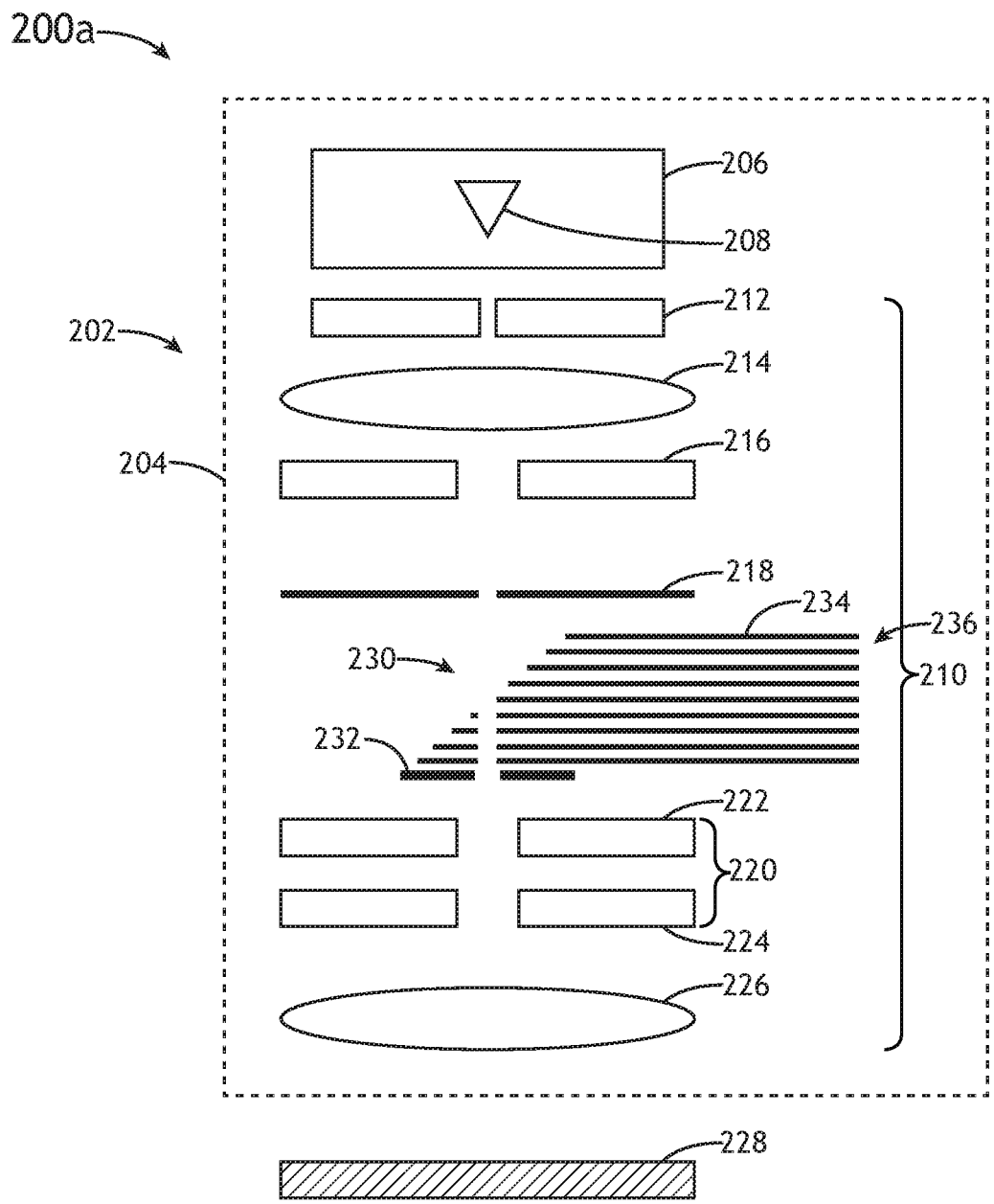
FIG. 2A is a conceptual view of an electron-beam inspection system utilizing a scintillator substrate and a light guide, in accordance with one or more embodiments of the present disclosure.
Figure 2B:
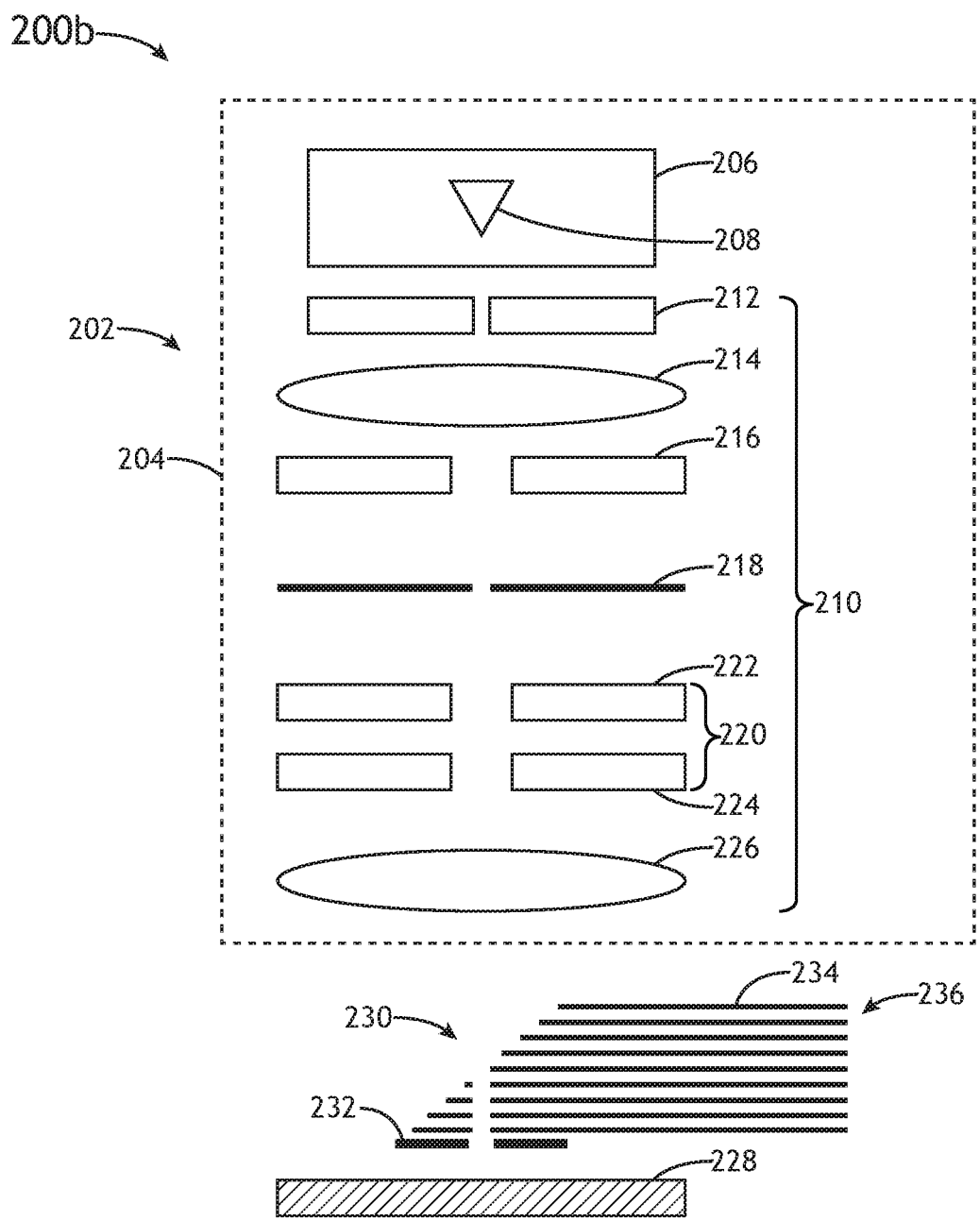
FIG. 2B is a conceptual view of the electron-beam inspection system utilizing a scintillator substrate and a light guide, in accordance with one or more embodiments of the present disclosure.

FIGS. 2A-2B illustrate conceptual views of an electron-beam inspection system 200a, 200b utilizing a scintillator substrate 232 and a light guide 234, in accordance with one or more embodiments of the present disclosure.

In embodiments, the electron-beam inspection system 200a, 200b may include an electron-optical column 202 configured to direct a primary electron beam from an electron beam source 206 (including an emitter 208) to the surface of a sample 228. In embodiments, the electron-optical column 202 may include any electron-optical column known in the art including, but not limited to, a micro-electron optical column (e.g., a miniature column), a micro-electromechanical systems (MEMS) column, a scanning electron microscopy (SEM) column, and the like.

The electron-optical column 202 may include a plurality of electron-optical elements 210 including, but not limited to, one or more extractors 212, one or more condenser lenses 214, one or more alignment deflectors 216, one or more beam limiting apertures 218, one or more scan deflectors 220 (e.g., an upper set of scan deflectors 222 and a lower set of scan deflectors 224), and one or more objective lenses 226. The various electron-optical elements of the electron-optical column 202 may be disposed within a vacuum chamber 204.

In some embodiments, instead of a silicon detector, the electron-beam inspection system 200a, 200b may include a detection assembly 230 including one or more scintillator substrates 232 and one or more light guides 234. In embodiments, the scintillator substrate 232 is configured to collect secondary and/or backscattered electrons emanated from the surface of the sample 250 in response to the primary electron beam 201. The scintillator substrate 232 may be further configured to generate optical radiation (e.g., light) in response to the collected secondary/backscattered electrons. Subsequently, the light guide 234 of the detection assembly 230 may be configured to receive the optical radiation generated by the scintillator substrate 232 and direct the optical radiation to one or more detectors (not shown in FIGS. 2A-2B). In embodiments, the light guide 234 may be configured to transmit optical radiation generated by the scintillator substrate 232 to the detectors through one or more vacuum-feedthrough ports 236 disposed within the vacuum chamber 204.

It is contemplated herein that the electron-beam inspection system 200a, 200b illustrated in FIGS. 2A-2B may provide a low-noise, low-profile, high-speed detection of secondary and/or backscattered electrons. By utilizing high-speed scintillator substrates 232 and a light guide 234, signals resulting from secondary electrons and backscattered electrons may be transmitted out of the vacuum chamber 204 to a detector (e.g., photomultiplier tube (PMT)) with low loss, high gain (e.g., 1 Mx), and low added noise. Further, by utilizing high-speed scintillator substrates 232 and a light guide 234, the detection assembly 230 may be thin such that the length of the column is short (e.g., low-profile). In this regard, the length of the column may be less than 75 mm.

It is further contemplated herein that the electron-beam inspection system 200a, 200b illustrated in FIG. 2A-2B may cure one or more shortfalls of the electron-beam inspection system 100 illustrated in FIG. 1. In particular, the detectors of the electron-beam inspection system 200 may be mounted outside of the vacuum chamber 204, rather than inside the vacuum chamber 104 of the electron-beam inspection system 100. By allowing the detectors to be mounted outside of the vacuum chamber 204, space constraints are alleviated, and the requirements for vacuum-compatible materials may be avoided. Additionally, the transmission of light in FIGS. 2A-2B (rather than the transmission of electrical signals in FIG. 1) may reduce noise and cross-talk. Furthermore, the electron-beam inspection system 200a, 200b illustrated in FIG. 2A-2B eliminates the need for amplifiers to be disposed within the vacuum chamber 204, thereby eliminating potentially negative outgassing effects.

While the detector assembly 230 (scintillator substrate 232 and light guide 234) are shown in a mid-column position in FIG. 2A, this is not to be regarded as a limitation of the present disclosure, unless noted otherwise herein. In this regard, the detector assembly 230 may be positioned at any point known in the art within the electron-optical column 202. For example, as described in further detail herein, the scintillator substrate 232 of the detection assembly 230 may be disposed around and/or adjacent to the optical axis of the electron-optical column 202. By way of another example, as shown in FIG. 2B, the detector assembly 230 (scintillator substrate and light guide) may be positioned outside of the vacuum chamber 204 and outside of the electro-optical column 202 (e.g., below the electron-optical column 202).

It is noted herein that although FIGS. 2A-2B depicts a specific configuration of electron-optical elements 210, such depiction is provided merely for illustrative purposes and shall not be construed as limiting the scope of the present disclosure. The electron-optical elements 210 may be in any configuration suitable for directing the primary electron beams to the surface of the sample.

The electron-beam inspection system 200a, 200b may be further shown and described with reference to an electron-inspection system 200 illustrated in FIG. 3.

Figure 3:
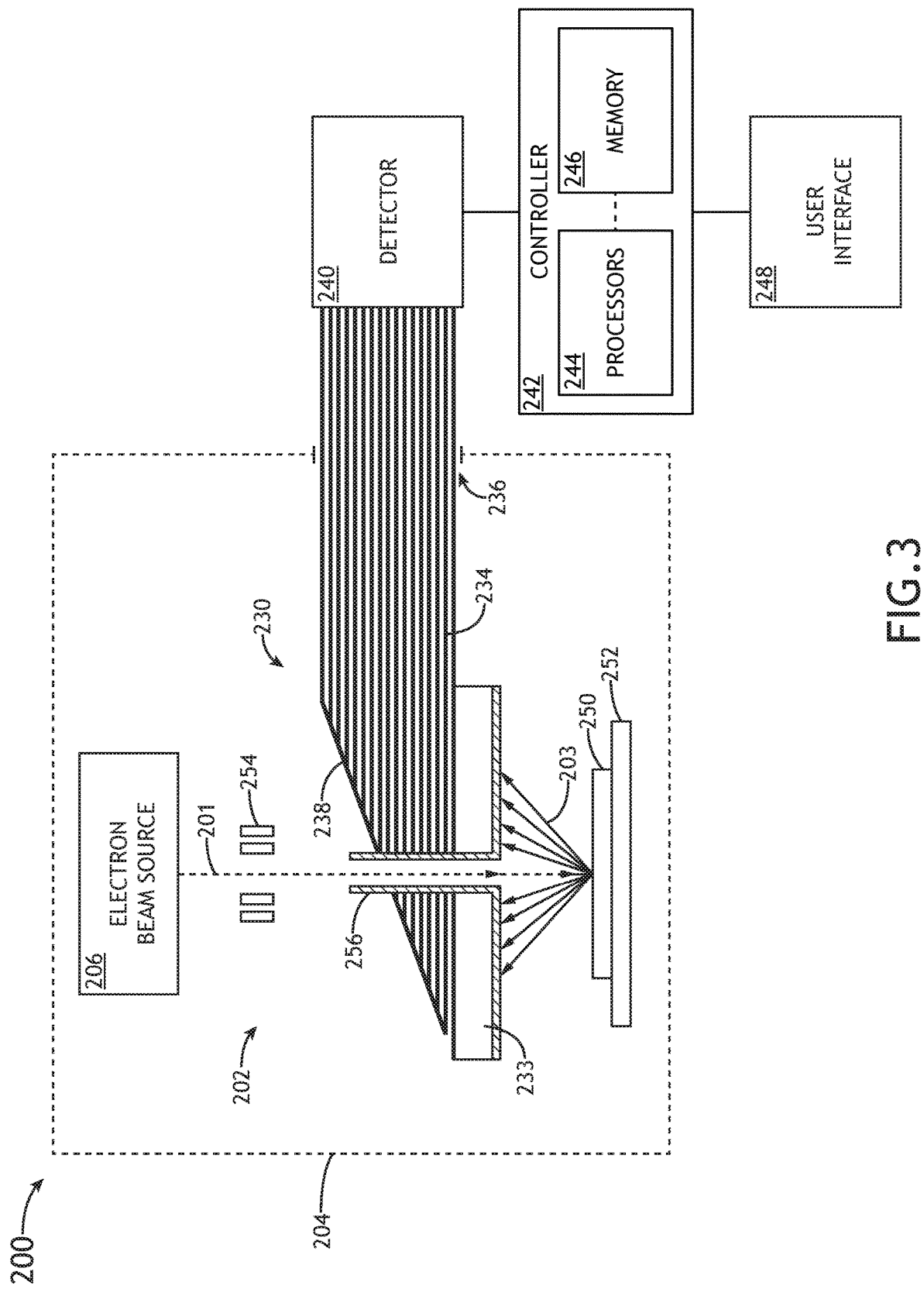
FIG. 3 is a conceptual view of the electron-beam inspection system utilizing a scintillator substrate and a light guide, in accordance with one or more embodiments of the present disclosure.

FIG. 3 is a conceptual view of an electron-beam inspection system 200 utilizing a scintillator substrate 232 and a light guide 234, in accordance with one or more embodiments of the present disclosure. It is noted herein that any discussion associated with the electron-beam inspection system 200a, 200b illustrated in FIGS. 2A-2B may be regarded as applying to the electron-beam inspection system 200 illustrated in FIG. 3, unless noted otherwise herein. Conversely, any discussion associated with the electron-beam inspection system 200 illustrated in FIG. 3 may be regarded as applying to the electron-beam inspection system 200a, 200b illustrated in FIGS. 2A-2B, unless noted otherwise herein.

In embodiments, the electron-beam inspection system 200 may include, but is not limited to, one or more electron beam sources 206, one or more electron-optical columns 202, a detection assembly 232, and a controller 242 including one or more processors 244 and a memory 246. In embodiments, the detection assembly 230 may include, but is not limited to, one or more scintillator substrates 232, one or more light guides 234, and one or more detectors 240.

In one embodiment, the electron-beam inspection system 200 is configured to inspect and/or measure a sample 250 disposed on a stage assembly 252. In this regard, the electron-beam inspection system 200 may be configured to acquire one or more images of the sample 250. In one embodiment, the electron beam source 206 is configured to generate one or more primary electron beams 201 and direct the one or more primary electron beams 201 to the sample 250. The electron beam source 206 may include any electron beam source known in the art including, but not limited to, electron guns, photocathode electron beam sources, and the like. However, it is further noted herein that embodiments of the present disclosure may be implemented in contexts other than electron beams and electron beam sources. In this regard, the system 200 may include any type of particle beam source known in the art including, but not limited to, ion guns, cathode sources, emitter tips, anodes, and the like.

In embodiments, the electron-optical column 202 may include one or more electron-optical elements 254 configured to receive the one or more primary electron beams 201 and focus and/or direct the one or more primary electron beams 201 to the sample 250. The one or more electron-optical elements 254 may include any electron-optical elements known in the art including, but not limited to, extractors, beam-limiting apertures, deflectors, electron-optical lenses, condenser lenses (e.g., magnetic condenser lenses), objective lenses (e.g., magnetic condenser lenses), and the like. By way of another example, the electron-beam inspection system 200 (e.g., electron-optical elements 254) may include one or more electron beam scanning elements including, but not limited to, one or more electromagnetic scanning coils or electrostatic deflectors suitable for controlling a position of the one or more primary electron beams 201 relative to the surface of the sample 250. Further, the one or more scanning elements may be utilized to scan the one or more primary electron beams 201 across the sample 250 in a selected pattern.

In embodiments, the electron beam source 206 and/or electron-optical column 202 (e.g., electron-optical elements 254) are configured to direct the one or more primary electron beams 201 through one or more shields 256 to the surface of the sample 250. Sample 250 may include any sample known in the art including, but not limited to, a wafer, a reticle, a photomask, and the like. In one embodiment, sample 250 is disposed on a stage assembly 252 to facilitate movement of sample 250. In another embodiment, the stage assembly 252 is an actuatable stage. For example, the stage assembly 252 may include, but is not limited to, one or more translational stages suitable for selectively translating the sample 250 along one or more linear directions (e.g., x-direction, y-direction, and/or z-direction). By way of another example, the stage assembly 252 may include, but is not limited to, one or more rotational stages suitable for selectively rotating the sample 250 along a rotational direction. By way of another example, the stage assembly 252 may include, but is not limited to, a rotational stage and a translational stage suitable for selectively translating the sample 250 along a linear direction and/or rotating the sample 250 along a rotational direction. It is noted herein that the electron-beam inspection system 200 may operate in any scanning mode known in the art.

In embodiments, the electron-optical inspection system 200 includes a detection assembly 230 configured to collect secondary and/or backscattered electrons 203 (hereinafter referred to as "secondary electrons 203" for simplicity) emanated from the surface of the sample 250 in response to the one or more primary electron beams 201. In embodiments, the detection assembly 230 may include, but is not limited to, one or more scintillator substrates 232, one or more light guides 234, and one or more detectors 240.

In embodiments, the scintillator substrate 232 is configured to collect secondary electrons 203 emanated from the surface of the sample 250 in response to the primary electron beam 201. The scintillator substrate 232 may be further configured to generate optical radiation (e.g., light) in response to the collected secondary electrons 203. The scintillator substrate 232 may be fabricated from any scintillator material known in the art including, but not limited to, sapphire substrates, glass substrates, and the like. The scintillator substrate 232 may exhibit varying thicknesses dependent upon the material of the scintillator substrate 232. For example, the scintillator substrate 232 may exhibit a thickness (e.g., height as shown in FIG. 3) of approximately 0.4 mm to 0.5 mm. In some embodiments, the electron-optical column 202 may include one or more electron-optical elements 254 configured to collect, and direct/focus secondary electrons 203 emanated from the surface of the sample 250 to the scintillator substrate 232.

Subsequently, the light guide 234 of the detection assembly 230 may be configured to receive the optical radiation generated by the scintillator substrate 232 and direct the optical radiation to one or more detectors 240. As noted previously herein, embodiments of the present disclosure may enable the detector 240 to be disposed exterior to the vacuum chamber 204 of the electron-beam inspection system 200, whereas various components of the electron-beam inspection system 200 (e.g., electron beam source 206, scintillator substrate 232, light guide 234) are disposed within the vacuum chamber 204. In this regard, in some embodiments, the light guide 234 may be configured to transmit optical radiation generated by the scintillator substrate 232 to the detectors 240 through one or more vacuum-feedthrough ports 236 disposed within the vacuum chamber 204.

It is contemplated herein that the light guide 234 may include any optical components known in the art configured to collect and direct optical radiation (e.g., light) generated by the one or more scintillator substrates 232. For example, the light guide 234 may include one or more optical fibers. For instance, the light guide 234 may include a bundle of optical fibers. By way of another example, the light guide 234 may include a solid light-conducting material (e.g., light tubes, optical waveguides, or the like).

In another embodiment, the detection assembly 230 includes one or more reflective and/or refractive surfaces configured to collect and direct (e.g., couple) light to the detectors 240. For example, the light guide 234 of the detection assembly 230 may include a reflective surface 238 which is configured at an angle with respect to a surface of the scintillator substrate 232, wherein the reflective surface 238 is configured to direct optical radiation (light) from the scintillator substrate 232 to the detectors 240. For instance, the reflective surface 238 may be configured at an angle between 35-55 degrees. The reflective surface 238 may include a mirrored surface, a surface treated with a metallic coating, or the like. For example, the reflective surface 238 may include an aluminum coating. By way of another example, one or more ends of the light guide 234 may include a reflective surface 238 configured at an angle with respect to a surface of the scintillator substrate 232.

In some embodiments, the detection assembly 230 may further include one or more index-matching materials configured to facilitate coupling of optical radiation out of the vacuum chamber 204. For example, the detection assembly 230 may include one or more index-matching materials disposed at an interface of the scintillator substrate 232 and the one or more light guides 234 in order to facilitate the collection and transmittal of optical radiation generated by the scintillator substrate 232.

In additional and/or alternative embodiments, the detection assembly 230 may further include one or more micro-optical elements configured to facilitate the transmission of optical radiation from the scintillator substrate 232. For example, the detection assembly 230 may include one or more micro-optical elements configured to focus at least a portion of the optical radiation generated by the scintillator substrate 232 to at least a portion of the light guide 234. For instance, in the context of a bundle of optical fibers, micro-optical elements may be used to focus portions of optical radiation generated at particular locations of the scintillator substrate 232 to specific optical fibers of the bundle of optical fibers. In this example, the micro-optical elements may be disposed between the scintillator substrate 232 and the light guide 234 (e.g., disposed on a surface of the scintillator substrate 232). It is noted herein that the addition of micro-optical elements within the detection assembly 230 may improve spatial resolution of generated optical radiation on the one or more detectors 240. The one or more micro-optical elements may include any micro-optical elements known in the art including, but not limited to, lenses, mirrors, prisms, beam splitters, and the like. For example, the one or more micro-optical elements may include, but are not limited to, a micro-lens array, one or more diffractive optical elements (DOEs), one or more refractive optical elements (ROEs), one or more homogenizers, or the like.

In embodiments, the one or more detectors 240 may be configured to receive the optical radiation (e.g., light) transmitted by the light guide 234. The detector 240 may include any detector known in the art configured to detect optical radiation generated by the scintillator substrate 232 including, but not limited to, a multi-channel or single channel detector. For example, the detector 240 may include, but is not limited to, a charge-coupled device (CCD), a complementary metal-oxide semiconductor (CMOS) device, a photomultiplier tube (PMT), a photodiode array, an avalanche photodiode detector (APD), an imaging device, and the like. In embodiments, the detectors 240 is configured to receive the optical radiation and generate signals and/or images based on the received optical radiation. In embodiments, the one or more detectors 240 are configured to generate one or more signals (e.g., detector signals) and/or one or more images in response to optical radiation received via the light guide 234.

The electron-beam inspection system 200 may further include a controller 242 communicatively coupled to the detector 240 and/or various components of the electron-beam inspection system 200 (e.g., electron beam source 206, electron-optical elements 254, stage assembly 252, and the like). The controller 242 controller may include one or more processors 244 configured to execute a set of program instructions stored in memory 246, the set of program instructions configured to cause the one or more processors 244 to carry out various steps/functions of the present disclosure. For example, the controller 242 may be configured to analyze the output of detector 240 (e.g., analyze images/detector signals). In another embodiment, the controller 242 is configured to analyze one or more characteristics of sample 250 based on detector signals received from the detector 240. In another embodiment, the controller 242 is configured to modify one or more characteristics of the electron-beam inspection system 200 in order to maintain focus on the sample 250. For example, the one or more processors 244 may be configured to adjust one or more characteristics of the electron beam source 206 and/or other elements of electron-beam inspection system 200 in order to focus of the primary electron beam 201 onto the surface of the sample 250. By way of another example, the controller 242 may be configured to adjust one or more focusing voltages applied to one or more electron-optical elements 254 in order to independently adjust the position or alignment of the one or more primary electron beams 201 and scan the primary electron beams 201 across the sample 250.

In additional embodiments, the controller 242 may be configured to receive detector signals and/or images generated by the one or more detectors 240 in response to the received optical radiation. The controller 242 may be configured to store received detector signals and/or images in memory 246. In embodiments, the controller 242 may be further configured to determine one or more characteristics of the sample 250 based on the received detector signals and/or images. Characteristics of the sample 250 which may be determined by the controller 242 based on signals/images received from the detector 240 may include, but are not limited to, measurements of the sample 250 (e.g., critical dimension (CD) measurements), the presence of defects on the sample 250, defect position, defect size, and the like. Determined characteristics may be stored in memory 246.

In additional and/or alternative embodiments, the controller 242 may be configured to generate one or more control signals configured to selectively adjust one or more characteristics of one or more process tools based on the one or more determined characteristics of the sample 250. In this regard, the controller 242 may be configured to generate one or more control signals in a feed-forward or feed-back loop in order to selectively adjust upstream and/or downstream process tools. Process tools which may be adjusted based on determined characteristics of the sample 250 may include, but are not limited to, lithography tools, etching tools, polishing tools, deposition tools, and the like.

In another embodiment, as shown in FIG. 3, electron-beam inspection system 200 includes a user interface 248 communicatively coupled to the controller 242. In another embodiment, the user interface 248 includes a user input device and a display. The user input device of the user interface 248 may be configured to receive one or more input commands from a user, the one or more input commands configured to input data into electron-beam inspection system 200 and/or adjust one or more characteristics of electron-beam inspection system 200. In another embodiment, the display of the user interface 248 may be configured to display data of electron-beam inspection system 200 to a user.

It is noted that the electron-beam inspection system 200 is not limited to the electron-optical elements depicted in FIGS. 2A, 2B, and 3, which are provided merely for illustrative purposes. It is further noted that the electron-beam inspection system 200 may include any number and type of electron-optical elements necessary to direct/focus the one or more primary electron beams 201 onto the sample 250 and, in response, collect and image the emanated secondary and/or backscattered electrons 203 onto the scintillator substrate 232.

FIG. 4A is a schematic view of a scintillator substrate 232 of an electron-beam inspection system 200, in accordance with one or more embodiments of the present disclosure.

As noted previously herein with respect to FIG. 3, the electron beam source 206 and/or electron-optical elements 254 may be configured to direct one or more primary electron beams 201 through a shield 256 to an active area 260 of the scintillator substrate 232. In some embodiments, the shield 256 may exhibit an inner diameter 258 on the order of 50-100 µm in order to transmit the primary electron beam 201 (as shown in FIG. 3). The active area 260 of the scintillator substrate 232 may exhibit a diameter on the order of 4-5 mm and a dead area 262 outside of the active area 260 and extending to the edge of the scintillator substrate 232. The scintillator substrate 232 may have a diameter on the order of 8-9 mm. It is noted herein that these dimensions are merely exemplary and therefore shall not be construed as limiting the scope of the present disclosure. The dimensions may be chosen to match to the geometry and dimensions of the electron-optical column.

FIG. 4B is a schematic view of a scintillator substrate 232 of an electron-beam inspection system 200, in accordance with one or more embodiments of the present disclosure.

In some embodiments, the one or more scintillator substrates 232 may be divided up into a plurality of regions 264a-264d. It is contemplated herein that dividing up a scintillator substrate 232 into two or more regions may provide for an increased level of spatial resolution on the scintillator substrate 232 and/or detector 240. For example, as shown in FIG. 4B, the scintillator substrate 232 may be divided up into four separate regions (e.g., four separate quadrants) including a first region 264a, a second region 264b, a third region 264c, and a fourth region 264d. It is contemplated herein that the separate regions 264a-264d of the scintillator substrate 232 may or may not be physically spatially separated from one another. For example, the scintillator substrate 232 may be divided up into multiple regions 264a-264d only nominally, such that the scintillator substrate 232 still includes one cohesive, continuous scintillator substrate 232. By way of another example, the scintillator substrate 232 may be physically and spatially divided up into multiple regions 264a-264d, such that each region 264a-264d of the scintillator substrate 232 is separated from adjacent regions 264a-264d by a space or gap.

In some embodiments, each individual region 264a-264d of the scintillator substrate 232 may be coupled to a single detector 240 via individual light guides, wherein the detector 240 is capable of spatial resolution and determining which optical radiation is originating from which individual region 264a-264d. Accordingly, it is recognized herein that dividing up the one or more scintillator substrates 232 into separate regions 264a-264n may enable improved spatial resolution (e.g., angular distribution) of the scintillator substrates 232 and/or detector 240, and may enable the electron-beam inspection system 200 to more accurately characterize the sample 250.

While the scintillator substrate 232 in FIG. 4B is shown and described as being divided up into four separate quadrants, this is not to be regarded as a limitation of the present disclosure, unless noted otherwise herein. In this regard, the scintillator substrate 232 may be divided up into any number, shape, and/or configuration of regions 264a-264n known in the art.

FIG. 5A is a schematic view of an array of scintillator substrates 268 of a multi-column inspection system 200, in accordance with one or more embodiments of the present disclosure.

In some embodiments, the electron-beam inspection system 200 may include a multi-column inspection system 200 configured to generate an array of primary electron beams 201. For example, the electron-beam inspection system 200 may include one or more electron beam sources 206 configured to generate an array of primary electron beams 201a-201n with a plurality of electron-optical columns 202a-202n. In this example, each electron-optical column 202a-202n may be configured to direct a primary electron beam 201 of the plurality of primary electron beams 201a-201n to sample 250.

For instance, as shown in FIG. 5A, the electron-beam inspection system 200 may include a plurality of electron-optical columns 202a-202n arranged in a 4×4 array. Each electron-optical column 202a-202n may be configured to direct a primary electron beam 201a-201n to the sample 250 at an array of locations/positions. In this example, the electron-beam inspection system 200 may include an array of scintillator substrates 232a-232n configured to collect secondary electrons 203 emanating from the array of locations on the sample 250 in response to the plurality of primary electron beams 201a-201n. In this regard, the electron-beam inspection system 200 may be arranged in a multi-column configuration (e.g., 4×4 column configuration). It may be appreciated herein that the plurality of electron-optical columns 202a-202n of the electron-beam inspection system 200 may include any number, arrangement, or configuration of columns known in the art. The arrangement of the columns is not limited to a square array, such as 4×4. The columns may be arranged in a rectangular array (e.g., in an array with different numbers of columns in the x- and y-directions), in a single row, in two rows, or in other configurations.

FIG. 5B is a conceptual view of an array of scintillator substrates 268 in a multi-column inspection system 200, in accordance with one or more embodiments of the present disclosure.

In some embodiments, each electron-optical column 202a-202b of a multi-column electron-beam inspection system 200 may include a separate detection assembly 240. For example, as shown in FIG. 5B, the electron-beam inspection system 200 may include a first electron-optical column 202a, a second electron-optical column 202b, a third electron-optical column 202c, and an nth electron-optical column 202n. Each electron-optical column 202a-202n may be configured to direct a primary electron beam 201a-201n to a sample 250 (and/or multiple samples 250a-250n). Further, each electron-optical column 202a-202n may include an individual scintillator substrate 232a-232n configured to collect secondary electrons 203. In this example, the first scintillator substrate 232a of the first electron-optical column 202a may be coupled to a first light guide 234a and a first detector 240a. Similarly, the second scintillator substrate 232b of the second electron-optical column 202b may be coupled to a second light guide 234b and a second detector 240b, the third scintillator substrate 232c of the third electron-optical column 202c may be coupled to a third light guide 234c and a third detector 240c, and the nth scintillator substrate 232n of the nth electron-optical column 202n may be coupled to an nth light guide 234n and an nth detector 240n.

In some embodiments, one or more of the scintillator substrates 232 depicted in FIGS. 5A-5B are segmented into two or more segments, as depicted in FIG. 4B. In this regard, the discussion related to the segmentation of scintillator substrates 232 shown in FIG. 4B should be interpreted to extend to the embodiments of FIGS. 5A-5B. In the case of segmented substrates 232 incorporated into the array 268 depicted in FIGS. 5A-5B, each region of the segmented scintillator substrate 232 may be optically coupled to one or more detectors 240 via a separate light guide 234. In this regard, the various regions of the scintillator substrate 232 may be optically coupled to an array of detectors. For example, referring to the scintillator substrate 232 illustrated in FIG. 4B and the array of scintillator substrates 268 in FIGS. 5A-5B, the first region 264a of the scintillator substrate 232 may be coupled to a first detector 240a via a first light guide 234a. Similarly, the second region 264b of the scintillator substrate 232 may be coupled to a second detector 240b via a second light guide 234b, the third region 264c of the scintillator substrate 232 may be coupled to a third detector 240c via a third light guide 234c, and the fourth region 264d of the scintillator substrate 232 may be coupled to a fourth detector 240d via a fourth light guide 234d. In this example, each individual light guide 234a-234n may include a separate set of micro-optical elements (e.g., a first set of micro-optical elements, a second set of micro-optical elements, a third set of micro-optical elements, and a fourth set of micro-optical elements) configured to focus optical radiation generated by each individual region 264a-264d to the respective light guide.

By way of another example, each individual region 264a-264d of the scintillator substrate 232 may be coupled to a single detector 240 via individual light guides, wherein the detector 240 is capable of spatial resolution and determining which optical radiation is originating from which individual region 264a-264d. Accordingly, it is recognized herein that dividing up the one or more scintillator substrates 232 into separate regions 264a-264n may enable improved spatial resolution (e.g., angular distribution) of the scintillator substrates 232 and/or detector 240, and may enable the electron-beam inspection system 200 to more accurately characterize the sample 250.

It is noted herein that the one or more components of electron-beam inspection system 200 may be communicatively coupled to the various other components of electron-beam inspection system 200 in any manner known in the art. For example, the one or more processors 244 may be communicatively coupled to each other and other components of the electron-beam inspection system 200 via a wireline (e.g., copper wire, fiber optic cable, and the like) or wireless connection (e.g., RF coupling, IR coupling, data network communication, WiFi, WiMax, Bluetooth, 3G, 4G, 4G LTE, 5G, and the like).

In one embodiment, the one or more processors 244 may include any one or more processing elements known in the art. In this sense, the one or more processors 244 may include any microprocessor-type device configured to execute software algorithms and/or instructions. In one embodiment, the one or more processors 244 may consist of a desktop computer, mainframe computer system, workstation, image computer, parallel processor, or other computer system (e.g., networked computer) configured to execute a program configured to operate the electron-beam inspection system 200, as described throughout the present disclosure.

It should be recognized that the steps described throughout the present disclosure may be carried out by a single computer system or, alternatively, multiple computer systems. In general, the term "processor" may be broadly defined to encompass any device having one or more processing elements, which execute program instructions from memory 246. Moreover, different subsystems of the electron-beam inspection system 200 (e.g., electron beam source 206, electron-optical column 202, detector 240, controller 242, user interface 248) may include processor or logic elements suitable for carrying out at least a portion of the steps described throughout the present disclosure. Therefore, the above description should not be interpreted as a limitation on the present disclosure but merely an illustration.

The memory 246 may include any storage medium known in the art suitable for storing program instructions executable by the associated one or more processors 244 and/or images received from the detector 240. For example, the memory 246 may include a non-transitory memory medium. For instance, the memory 246 may include, but is not limited to, a read-only memory (ROM), a random-access memory (RAM), a magnetic or optical memory device (e.g., disk), a magnetic tape, a solid-state drive and the like. It is further noted that memory 246 may be housed in a common controller housing with the one or more processors 244. In an alternative embodiment, the memory 246 may be located remotely with respect to the physical location of the processors 244, controller 242, and the like. In another embodiment, the memory 246 maintains program instructions for causing the one or more processors 244 to carry out the various steps described through the present disclosure.

In one embodiment, the user interface 248 is communicatively coupled to the controller 242. In one embodiment, the user interface 248 may include, but is not limited to, one or more desktops, tablets, smartphones, smart watches, or the like. In another embodiment, the user interface 219 includes a display used to display data of the electron-beam inspection system 200 to a user. The display of the user interface 248 may include any display known in the art. For example, the display may include, but is not limited to, a liquid crystal display (LCD), an organic light-emitting diode (OLED) based display, or a CRT display. Those skilled in the art should recognize that any display device capable of integration with a user interface 248 is suitable for implementation in the present disclosure. In another embodiment, a user may input selections and/or instructions responsive to data displayed to the user via the user interface 248.

Figure 6:
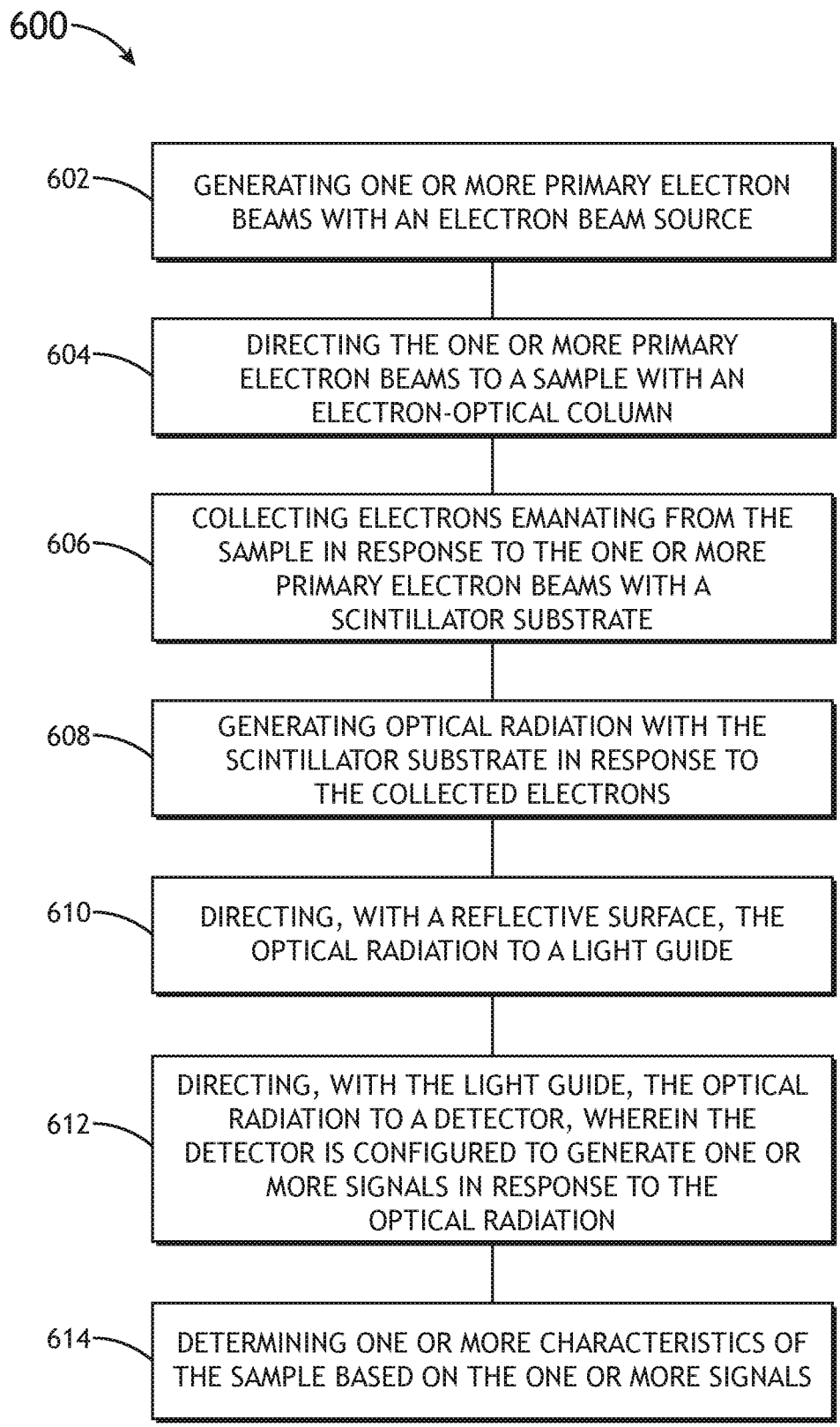
FIG. 6 illustrates a flowchart of a method for electron-beam inspection, in accordance with one or more embodiments of the present disclosure.

FIG. 6 illustrates a flowchart of a method 600 for operating an electron-beam inspection system 200, in accordance with one or more embodiments of the present disclosure. It is noted herein that the steps of method 600 may be implemented all or in part by electron-beam inspection system 200. It is further recognized, however, that the method 600 is not limited to the electron-beam inspection system 200 in that additional or alternative system-level embodiments may carry out all or part of the steps of method 600.

In a step 602, one or more primary electron beams are generated with an electron beam source. For example, as shown in FIG. 3, the electron beam source 206 is configured to generate one or more primary electron beams 201 and direct the one or more primary electron beams 201 to the sample 250. The electron beam source 206 may include any electron beam source known in the art including, but not limited to, electron guns, photocathode electron beam sources, and the like.

In a step 604, the one or more primary electron beams are directed to a sample with an electron-optical column. For example, the electron-optical column 202 may include one or more electron-optical elements 254 configured to receive the one or more primary electron beams 201 and direct the one or more primary electron beams 201 to the sample 250. The one or more electron-optical elements 254 may include any electron-optical elements known in the art including, but not limited to, extractors, beam-limiting apertures, deflectors, electron-optical lenses, condenser lenses (e.g., magnetic condenser lenses), objective lenses (e.g., magnetic condenser lenses), and the like.

In a step 606, electrons emanating from the sample in response to the one or more primary electron beams are collected with a scintillator substrate. For example, the scintillator substrate 232 is configured to collect secondary electrons 203 emanated from the surface of the sample 250 in response to the primary electron beam 201. The scintillator substrate 232 may be fabricated from any scintillator material known in the art including, but not limited to, sapphire substrates, glass substrates, and the like.

In a step 608, optical radiation is generated with the scintillator substrate in response to the collected electrons. For example, the scintillator substrate 232 may be further configured to generate optical radiation (e.g., light) in response to the collected secondary electrons 203.

In a step 610, the optical radiation is directed to a light guide using a reflective surface. In embodiments, the detection assembly 230 may include a reflective surface 238 configured to direct the optical radiation to an input surface of a light guide 234. For example, the reflective surface 238 may be configured at an angle (e.g., 35-55 degrees) with respect to a surface of the scintillator substrate 232.

In a step 612, the optical radiation is directed to a detector using the light guide. In embodiments, the detector 240 is configured to generate one or more signals in response to the optical radiation. For example, the light guide 234 of the detection assembly 230 may be configured to receive the optical radiation generated by the scintillator substrate 232 and direct the optical radiation to one or more detectors 240. The light guide 234 may include any optical components known in the art configured to collect and direct optical radiation (e.g., light) generated by the one or more scintillator substrates 232 including, but not limited to, one or more optical fibers, one or more bundles of optical fibers, one or more light tubes, one or more optical waveguides, and the like.

In a step 614, one or more characteristics of the sample are determined based on the one or more signals. For example, the controller 242 may be further configured to determine one or more characteristics of the sample 250 based on the received detector signals and/or images. Characteristics of the sample 250 which may be determined by the controller 242 based on signals/images received from the detector 240 may include, but are not limited to, measurements of the sample 250 (e.g., critical dimension (CD) measurements), the presence of defects on the sample 250, defect position, defect size, and the like.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken as limiting.

Those having skill in the art will appreciate that there are various vehicles by which processes and/or systems and/or other technologies described herein can be implemented (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The previous description is presented to enable one of ordinary skill in the art to make and use the invention as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An electron beam inspection system, comprising:
    an electron beam source configured to generate a plurality of primary electron beams;
    an electron-optical column including a set of electron-optical elements configured to direct the plurality of primary electron beams to a sample; and
    a detection assembly comprising:
        a scintillator substrate configured to collect electrons emanating from the sample in response to the plurality of primary electron beams, the scintillator substrate configured to generate optical radiation in response to the collected electrons;
        one or more light guides;
        one or more reflective surfaces configured to receive the optical radiation generated by the scintillator substrate and direct the optical radiation along the one or more light guides; and
        one or more detectors configured to receive the optical radiation from the light guide.

2. The electron beam inspection system of claim 1, wherein the electron-optical column comprises a plurality of electron-optical columns.

3. The electron beam inspection system of claim 1, wherein the electron-optical column comprises one or more micro-electron optical columns.

4. The electron beam inspection system of claim 1, further comprising a controller communicatively coupled to the one or more detectors, the controller including one or more processors configured to execute a set of program instructions stored in memory, the set of program instructions configured to cause the one or more processors to:
    receive one or more signals generated by the one or more detectors in response to the optical radiation; and
    determine one or more characteristics of the sample based on the one or more signals.

5. The electron beam inspection system of claim 4, wherein the one or more characteristics of the sample comprise at least one of a measurement of the sample or a defect of the sample.

6. The electron beam inspection system of claim 4, wherein the controller is configured to generate one or more control signals configured to selectively adjust one or more characteristics of one or more process tools based on the one or more determined characteristics.

7. The electron beam inspection system of claim 1, wherein the sample and scintillator substrate are disposed within a vacuum chamber, and wherein the one or more detectors are disposed exterior to the vacuum chamber.

8. The electron beam inspection system of claim 7, wherein the one or more light guides are configured to direct the optical radiation generated by the scintillator substrate to the one or more detectors through at least one vacuum-feedthrough port in the vacuum chamber.

9. The electron beam inspection system of claim 1, the detection assembly further comprising one or more index-matching materials disposed at an interface of the scintillator substrate and the one or more light guides.

10. The electron beam inspection system of claim 1, wherein a light guide of the one or more light guides comprises a bundle of one or more optical fibers.

11. The electron beam inspection system of claim 10, wherein the light guide of the one or more light guides further comprises:
    one or more micro-optical elements configured to focus at least a portion of the optical radiation generated by the scintillator substrate to at least a portion of the bundle of one or more optical fibers.

12. The electron beam inspection system of claim 1, wherein the one or more detectors comprise at least one of a charge-coupled device (CCD), a complementary metal-oxide semiconductor (CMOS) device, a photomultiplier tube (PMT), an avalanche photodiode (APD), or a photo-diode array.

13. The electron beam inspection system of claim 1, wherein the scintillator substrate is divided up into a first region and at least one additional region.

14. The electron beam inspection system of claim 13, wherein the one or more light guides comprise:
    a first light guide configured to receive optical radiation generated by the first region of the scintillator substrate and direct the optical radiation to a first detector; and
    at least one additional light guide configured to receive optical radiation generated by the at least one additional region of the scintillator substrate and direct the optical radiation to at least one additional detector.

15. The electron beam inspection system of claim 14,
    wherein the first light guide includes a first set of micro-optical elements configured to focus the optical radiation generated by the first region of the scintillator substrate, and
    wherein the at least one additional light guide includes at least one additional set of micro-optical elements configured to focus the optical radiation generated by the at least one additional region of the scintillator substrate.

16. The electron beam inspection system of claim 1, wherein the one or more reflective surfaces are configured at an angle with respect to a surface of the scintillator substrate.

17. The electron beam inspection system of claim 16, wherein the angle of the reflective surface is between 35-55 degrees.

18. A multi-column inspection system, comprising:
    an electron beam source configured to generate an array of primary electron beams;
    a plurality of electron-optical columns, each electron-optical column includes a set of electron-optical elements configured to direct a primary electron beam of the array of primary electron beams to a sample at an array of locations, wherein the plurality of electron-optical columns comprises a plurality of micro-electron optical columns; and
    a detection assembly comprising:
        an array of scintillator substrates configured to collect electrons emanating from the sample in response to the array of primary electron beams, the array of scintillator substrates configured to generate optical radiation in response to the collected electrons;

a plurality of light guides, the plurality of light guides optically coupled to the array of scintillator substrates;

a plurality of reflective surfaces configured to receive the optical radiation generated by a scintillator substrate of the array of scintillator substrates; and a plurality of detectors optically coupled to the plurality of light guides, each detector of the plurality of detectors configured to receive the optical radiation from a light guide of the plurality of light guides.

19. The multi-column inspection system of claim 18, further comprising a controller communicatively coupled to the plurality detectors, the controller including one or more processors configured to execute a set of program instructions stored in memory, the set of program instructions configured to cause the one or more processors to:

receive one or more signals generated by the plurality of detectors in response to the optical radiation; and determine one or more characteristics of the sample based on the one or more signals.

20. The multi-column inspection system of claim 18, wherein the sample and the array of scintillator substrates are disposed within a vacuum chamber, and wherein the plurality of detectors are disposed exterior to the vacuum chamber.

21. The multi-column inspection system of claim 20, wherein the one or more light guides are configured to direct the optical radiation generated by the array of scintillator substrates to the plurality of detectors through at least one vacuum-feedthrough port in the vacuum chamber.

22. The multi-column inspection system of claim 18, the detection assembly further comprising one or more index-matching materials disposed at an interface of the array of scintillator substrates and the plurality of light guides.

23. The multi-column inspection system of claim 18, wherein the light guide of the plurality of light guides comprises a bundle of one or more optical fibers.

24. The multi-column inspection system of claim 23, wherein the light guide of the plurality of light guides further comprises:

one or more micro-optical elements configured to focus at least a portion of the optical radiation generated by the scintillator substrate to at least a portion of the bundle of one or more optical fibers.

25. The multi-column inspection system of claim 18, wherein the plurality of detectors comprise at least one of a charge-coupled device (CCD), a complementary metal-oxide semiconductor (CMOS) device, a photomultiplier tube (PMT), an avalanche photodiode (APD), or a photodiode array.

26. The multi-column inspection system of claim 18, wherein at least one scintillator substrate of the plurality of scintillator substrates is divided up into a first region and at least one additional region.

27. The multi-column inspection system of claim 26, wherein at least one light guide of the plurality of light guides comprise:

a first light guide configured to receive optical radiation generated by the first region of the scintillator substrate and direct the optical radiation to a first detector; and at least one additional light guide configured to receive optical radiation generated by the at least one additional region of the scintillator substrate and direct the optical radiation to at least one additional detector.

28. The multi-column inspection system of claim 27, wherein the first light guide includes a first set of micro-optical elements configured to focus the optical radiation generated by the first region of the scintillator substrate, and wherein the at least one additional light guide includes at least one additional set of micro-optical elements configured to focus the optical radiation generated by the at least one additional region of the scintillator substrate.

29. The multi-column inspection system of claim 18, wherein the plurality of reflective surfaces are configured at an angle with respect to a surface of the array of scintillator substrates.

30. The multi-column inspection system of claim 29, wherein the angle of the reflective surface is between 35-55 degrees.

31. A method, comprising:

generating a plurality of primary electron beams with an electron beam source;

directing the plurality of primary electron beams to a sample with an electron-optical column;

collecting electrons emanating from the sample in response to the plurality of primary electron beams with a scintillator substrate;

generating optical radiation with the scintillator substrate in response to the collected electrons;

directing, with a reflective surface, the optical radiation to a light guide;

directing, with the light guide, the optical radiation to a detector, wherein the detector is configured to generate one or more signals in response to the optical radiation; and determining one or more characteristics of the sample based on the one or more signals.

* * * * *